United States Patent [19]
Lin et al.

[11] Patent Number: 5,652,160
[45] Date of Patent: Jul. 29, 1997

[54] METHOD OF FABRICATING A BURIED CONTACT STRUCTURE WITH $WSi_x$ SIDEWALL SPACERS

[75] Inventors: Jengping Lin, Taoyuan Hsien; Sun-Chieh Chien, Hsinchu, both of Taiwan

[73] Assignee: United Microelectronics Corp., Hsinchu, Taiwan

[21] Appl. No.: 613,092

[22] Filed: Mar. 8, 1996

[51] Int. Cl.$^6$ ................................................ H01L 21/335
[52] U.S. Cl. .................... 437/41 SM; 437/44; 437/187; 437/193; 437/200
[58] Field of Search ............... 437/41 GS, 41 SM, 437/193, 200, 228 S, 228 ES, 187, 189, 44; 257/377, 385

[56] References Cited

U.S. PATENT DOCUMENTS

| | | | |
|---|---|---|---|
| 5,326,713 | 7/1994 | Lee | 437/41 |
| 5,543,362 | 8/1996 | Wu | 437/200 |

*Primary Examiner*—T. N. Quach
*Attorney, Agent, or Firm*—Ladas & Parry

[57] ABSTRACT

A method of forming $WSi_x$ sidewall spacers as an etching stop in the fabrication process of a buried contact. After a gate dielectric layer and a first conducting layer are formed over a substrate, an opening is formed by etching through the gate dielectric layer and first conducting layer. $WSi_x$ sidewall spacers are thereafter formed on the sidewalls of the opening. Then, a second conducting layer is deposited onto the overall surface as well as being connected to the substrate via the opening. When the second and first conducting layers are patterned and etched to form a gate electrode and an interconnect layer, the $WSi_x$ acts as the etching stop to prevent the formation of ditches in the substrate.

9 Claims, 4 Drawing Sheets

METHOD OF FABRICATING A BURIED CONTACT STRUCTURE WITH $WSI_x$ SIDEWALL SPACERS

BACKGROUND OF THE INVENTION

1. Field of the Invention

The present invention relates to a method of fabricating a buried contact structure used in MOS and bipolar (including BiMOS or BiCMOS) semiconductor devices, and more particularly to a method of fabricating a buried contact structure by using $WSi_x$ spacers as an etching stop during the process of defining a gate electrode so as to prevent the formation of ditches in a substrate.

2. Description of the Related Art

Buried contacts have been extensively used in MOS or bipolar integrated circuits. For example, buried contacts are used in a MOS SRAM (static random-access memory) cell, which employs two loads (active load or passive load) and two cross-coupled MOS transistors, to connect each gate electrode to the drain region of the opposing cross-coupled MOS transistors. In a typical memory cell architecture, the buried contacts are also electrically connected to source/drain regions of MOS transistors, which form transmission-gates to provide data paths into or out of the memory cell. Consequently, buried contacts provide electrical interconnection among gate electrodes, drain regions of the cross-coupled MOS transistors and source/drain regions of the transmission-gate transistors.

A conventional process for the formation of buried contacts is depicted in FIGS. 1A through 1D, which are cross-sectional views along line I—I of FIG. 2. Referring to FIG. 1A, field oxide 11 is first formed on P-type semiconductor substrate 10 as an isolating structure so as to define active region 12 (as shown in FIG. 2) bounded thereby.

As well known in this art, field oxides 11 are formed by a so-called LOCOS (local oxide of silicon) process. Then, gate oxide layer 13 is thermally grown on the surface of substrate 10 not covered by field oxides 11. First polysilicon layer 14a is then deposited on field oxides 11 and gate oxide layer 13. Thereafter, first polysilicon layer 14a and gate oxide layer 13 are patterned and etched to form opening 15 to expose a portion of substrate 10.

Referring to FIG. 1B, second polysilicon layer 14b is conformably deposited over exposed substrate 10 via opening 15 and first polysilicon layer 14a. After that, impurities, such as N-type ions (e.g., phosphorus ions), are implanted into second polysilicon layer 14b to increase the conductivity thereof. After thermal annealing is performed, the implanted impurities contained in second polysilicon layer 14b are diffused into substrate 10 to form N-type heavily-doped region 25, designated as $N^+$ in the drawing. Then, photoresist layer 16 with gate and interconnect patterns is formed on second polysilicon layer 14b.

Next, referring to FIG. 1C, by utilizing photoresist layer 16 as a mask, second polysilicon layer 14b and first polysilicon layer 14a are subsequently etched to define transistor's gate electrode 17 and interconnect layer 18. Note that ditch 23 will be inevitably formed in substrate 1 during the etching process used to define gate electrode 17 and interconnect layer 18. This ditch formation occurs since there is poor substrate/polysilicon etch selectivity (the ratio of etching rates of different materials is known as the etching selectivity of an etch process) and no gate oxide layer 13 is provided within the region of opening 15 as an etching stop. As a result, the reactive ion etch gases used to etch polysilicon layers 14a and 14b also etch the single crystal silicon substrate 10 at about the same rate. Photoresist layer 16 is thereafter removed.

As next shown in FIG. 1D, another N-type ion implantation is applied to create N-type lightly-doped source drain regions 20 in substrate 10. Then, by chemical vapor deposition, an oxide layer is formed onto the overall surface. The CVD oxide layer is then removed by an etchback process to form oxide spacers 21 which remain on the sidewalls of gate electrode 17 and interconnect layer 18. Next, the other N-type ion implantation (e.g., implanting arsenic ions), which uses a higher implantation dose than that used for forming lightly-doped source/drain regions 20, is applied to form N-type heavily-doped source/drain regions 22 in substrate 10 to finish the process. The resulting structure depicted in FIG. 2 is a conventional buried contact structure in top view.

However, lattice defects, such as dislocation loops or the like, are formed around ditch 23, which cause a leakage current therethrough. Moreover, inevitably formed ditch 23 causes spacers 21 within opening 15 to thicken, thus reducing the dosage of impurities implanted in underlying heavily-doped source/drain region 22. This accordingly increases the resistance and thus induces the resistance deviation of heavily-doped region 22. Ditch 23 also results in poor step coverage in the subsequent process steps, for example in the deposition of pre-metal dielectric layer such as BPSG (borophosphosilicate glass), thus reducing the reliability of the resulting semiconductor devices.

SUMMARY OF THE INVENTION

Therefore, it is an object of the present invention to provide a method of fabricating a buried contact structure by utilizing $WSi_x$ spacers as an etching stop for preventing the formation of ditches.

Accordingly, the present invention achieves the above-identified object by providing a method of fabricating a buried contact structure. Isolating structures are formed on a semiconductor substrate. A gate dielectric layer is formed overlying the substrate not covered by the isolating structures. A first conducting layer is formed overlying the gate dielectric layer and isolating structures. The first conducting layer and gate dielectric layer are subsequently etched to form an opening. Sidewall spacers of $WSi_x$ are formed on sidewalls of the opening to expose the substrate. A second conducting layer is formed covering the first conducting layer and sidewall spacers of $WSi_x$ in contact with the exposed substrate via the opening. Impurities are implanted into the second conducting layer and then the impurities are diffused, through the opening, into the substrate to form a heavily-doped region by thermal annealing. The second and first conducting layers are subsequently etched to form a gate electrode between the isolating structures, and an interconnect layer connected to the heavily-doped region over the isolating structure by using the sidewall spacers of $WSi_x$ as an etching stop. Impurities are implanted into the substrate to form lightly-doped source/drain regions by utilizing the interconnect layer, $WSi_x$ sidewall spacers, and gate electrode as masking. Oxide spacers are then formed on sidewalls of the gate electrode as well as interconnect layer. Impurities are then implanted into the substrate to form heavily-doped source/drain regions by utilizing the gate electrode, interconnect layer, and oxide spacers as masking.

Other objects, features and advantages of the present invention will become apparent by way of the following detailed description of the preferred but non-limiting embodiment.

BRIEF DESCRIPTION OF THE DRAWINGS

The detailed description herein is made with reference to the accompanying drawings, wherein.

DESCRIPTION OF THE PREFERRED EMBODIMENTS

Figure 1A:
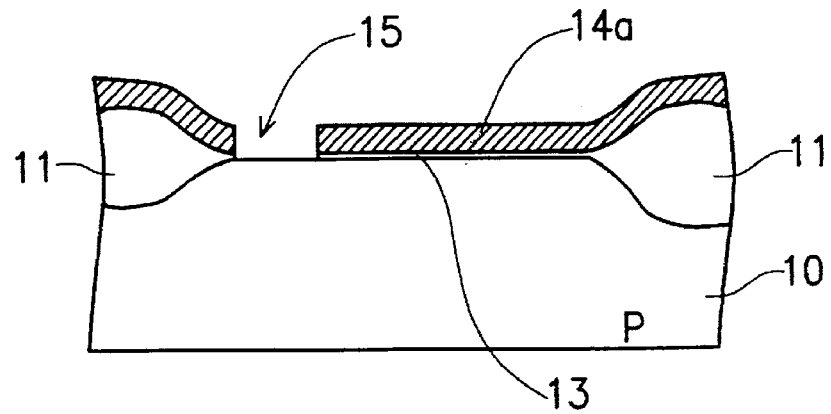
FIGS. 1A through 1D depict a conventional process of forming a buried contact in cross-sectional views.
Figure 1B:
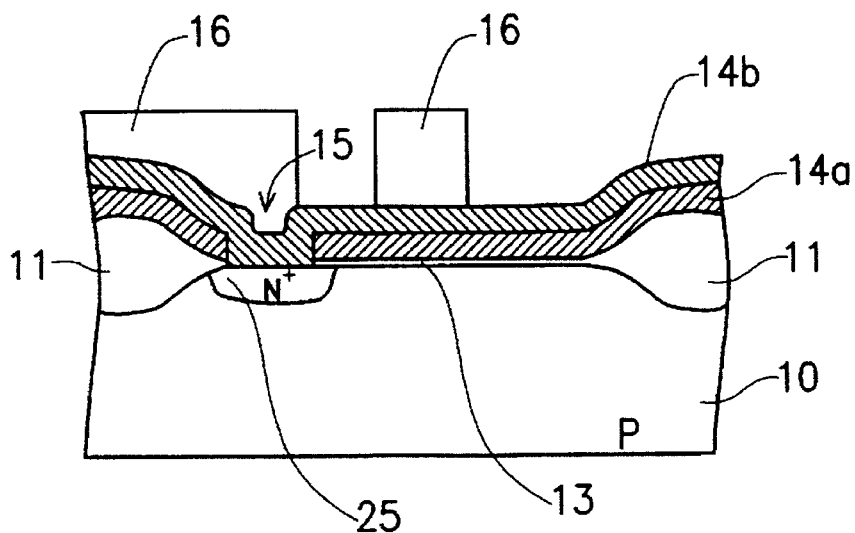
Figure 1C:
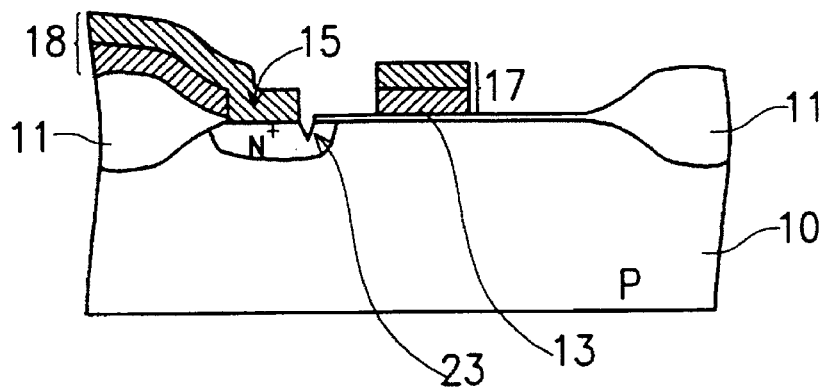
Figure 1D:
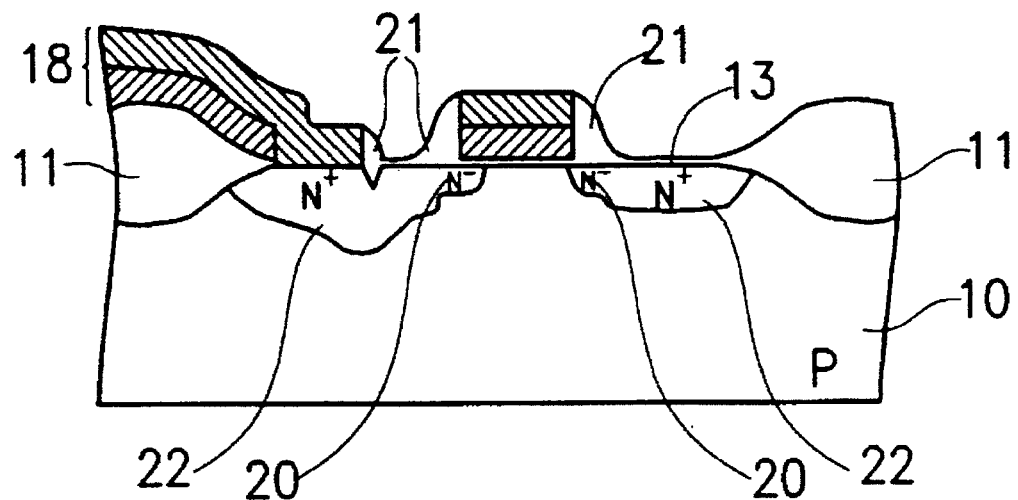
Figure 2:
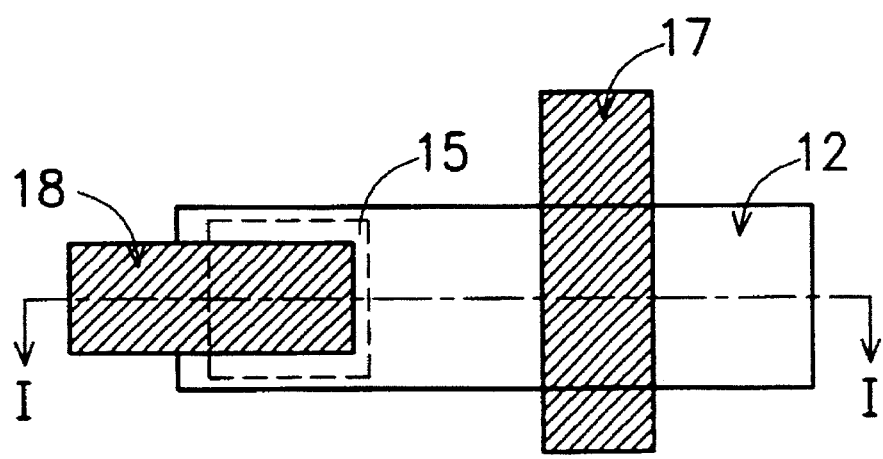
FIG. 2 depicts FIG. 1D in top view.
Figure 3A:
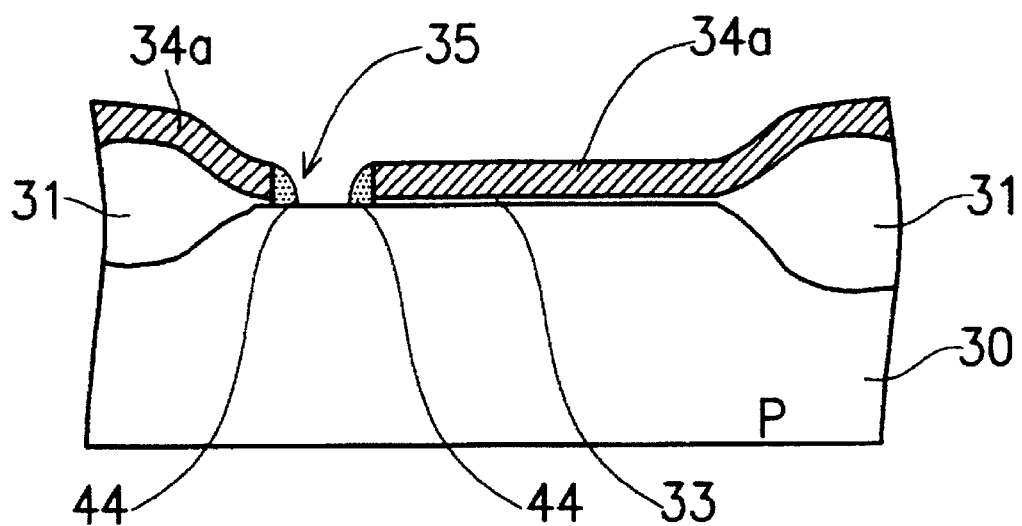
FIGS. 3A through 3D depict a fabrication process of one preferred embodiment, according to the present invention, in cross-sectional views.

First, as shown in FIG. 3A, field oxides 31 are first formed on semiconductor substrate 30, for instance, a P-type silicon wafer, as isolating structures so as to define an active region therebetween. Field oxides 31 may be formed by an LOCOS (local oxide of silicon) process. Then, gate dielectric layer 33 having a thickness of about 50–150 Å is formed on substrate 30 not covered by field oxides 31. Preferably, dielectric layer 33 is a thermally grown oxide layer. First conducting layer 34a, such as a polysilicon layer of about 400–2000 Å in thickness, is then deposited on field oxides 31 and gate oxide layer 33. By photolithography, first conducting layer 34a and gate oxide layer 33 are subsequently patterned and etched to form opening 35 to expose a portion of substrate 30. Next, sidewall spacers 44 of $WSi_x$ are formed on the sidewalls of opening 35. Preferably, $WSi_x$ spacers 44 are formed by first depositing a tungsten silicide layer having a thickness of about 500–2000 Å overlying the overall surface and then etching back.

Figure 3B:
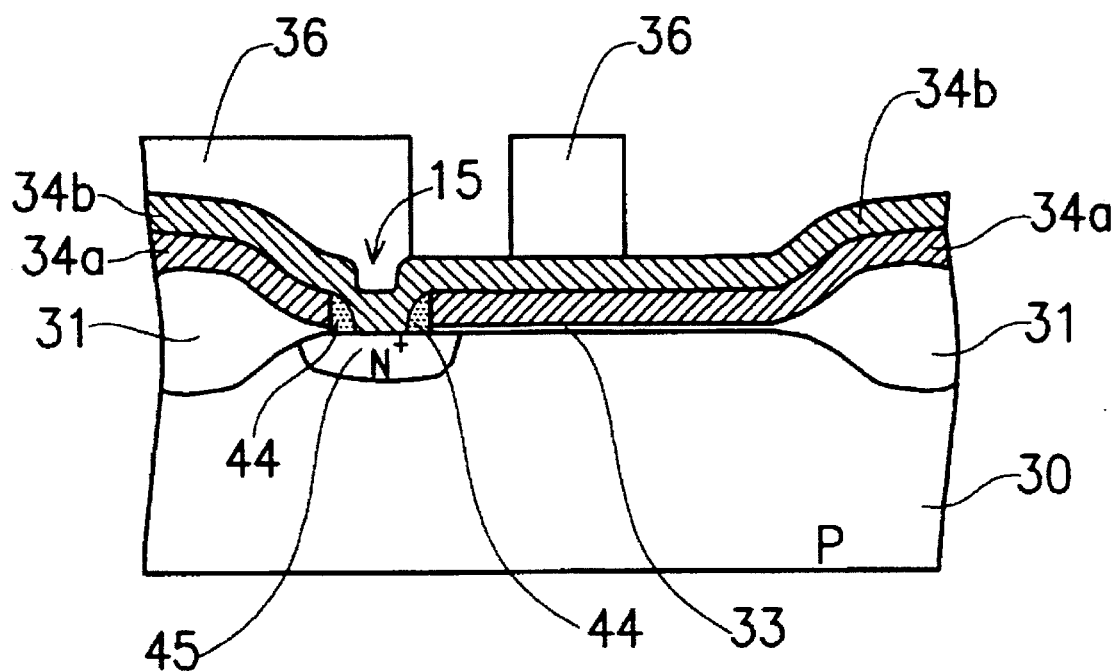

Referring to FIG. 3B, second conducting layer 34b, such as a CVD-deposited polysilicon layer of 400–2000 Å in thickness, is then conformably deposited over exposed substrate 30 at opening 35, first conducting layer 34a, and $WSi_x$ sidewall spacers 44. After that, impurities, such as phosphorus ions, are implanted into second conducting layer 34b at an energy of about 30–80 KeV and a dosage of about $1 \times 10^{15}$–$1 \times 10^{16}$ cm$^{-2}$. The Substrate 30 is thereafter subjected to thermal annealing in order to diffuse the implanted impurities contained in second conducting layer 34b into substrate 30 through opening 35 to form N-type heavily-doped region 45, designated as N⁺ in the drawing. Then, photoresist layer 36 with gate and interconnect patterns is formed on second conducting layer 34b.

Figure 3C:
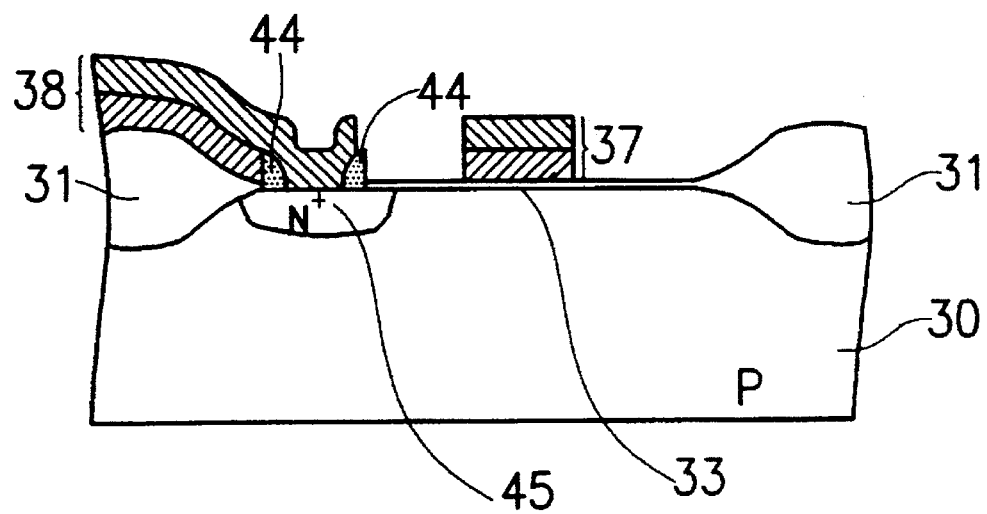

Next, referring to FIG. 3C, by utilizing photoresist layer 36 as a mask, second conducting layer 34b and first conducting layer 34a are anisotropically etched to define gate electrode 37 and interconnect layer 38. Preferably, reactive ion etching (RIE) is utilized to carry out this anisotropic etching procedure, using a mixture of $Cl_2$ and HBr as reactive gases. Since $WSi_x$ sidewall spacers 44 are immune to etching by the mixture of $Cl_2$ and HBr in the RIE mode, $WSi_x$ sidewall spacers 44 serve as an etching stop without suffering the formation of unnecessary ditches. Photoresist layer 36 is thereafter removed.

Figure 3D:
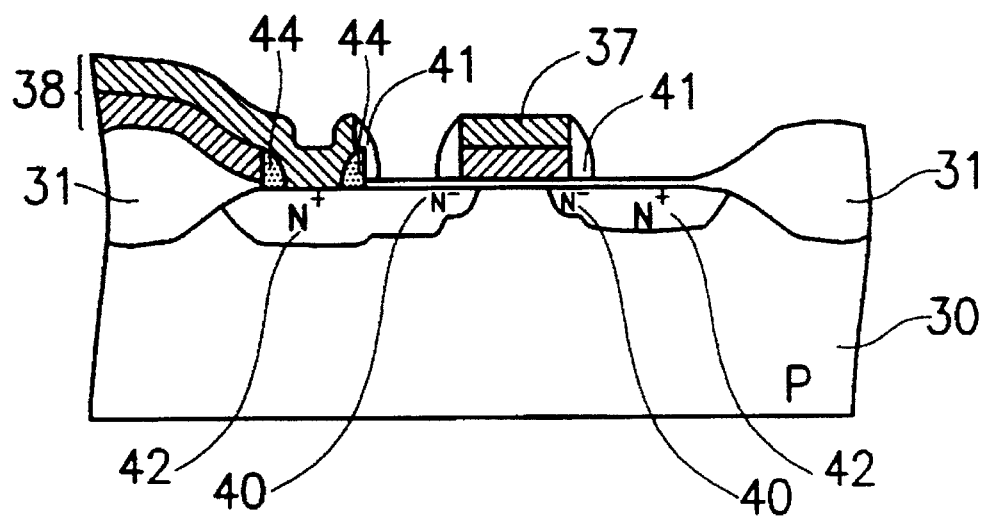

As next shown in FIG. 3D, by utilizing gate electrode 37, interconnect 38 and $WSi_x$ sidewall spacers 44 as masking, another N-type ion implantation is conducted to create N-type lightly-doped source/drain regions 40 in substrate 30 by implanting, such as phosphorus ions at an energy of about 50–70 KeV and a dosage of about $1 \times 10^{13}$–$5 \times 10^{13}$ cm$^{-2}$. Then, by chemical vapor deposition, an oxide layer is deposited onto the overall surface. The CVD oxide layer is then removed by etch back process to form oxide spacers 41 which remain on the sidewalls of gate electrode 37 and interconnect layer 38. Next, the other N-type ion implantation is performed by implanting arsenic ions at an energy of about 40–100 KeV and a dosage of about $1 \times 10^{15}$–$1 \times 10^{16}$ cm$^{-2}$ combining with heavily-doped region 45 to form N-type heavily-doped source/drain regions 42 in substrate 30 to finish the process.

In conclusion, the present invention makes use of the formation of the $WSi_x$ sidewall spacers prior to the deposition of the second conducting layer. The WSiX sidewall spacers can then act as an etching stop to prevent the formation of ditches in the substrate when the gate electrode and interconnect layer are patterned.

What is claimed is:

1. A method of fabricating a buried contact structure, comprising the steps of:

(a) forming isolating structures on a semiconductor substrate;

(b) forming a gate dielectric layer overlying said substrate not covered by said isolating structures;

(c) forming a first conducting layer overlying said gate dielectric layer and isolating structures;

(d) subsequently etching said first conducting layer and gate dielectric layer to form an opening;

(e) forming sidewall spacers of tungsten silicide on sidewalls of said opening to expose said substrate;

(f) forming a second conducting layer covering said first conducting layer and sidewall spacers of tungsten silicide in contact with said exposed substrate via said opening;

(g) implanting impurities into said second conducting layer and then, by subjecting the substrate to thermal annealing, diffusing said impurities through said opening into said substrate to form a heavily-doped region;

(h) subsequently etching said second and first conducting layers to form a gate electrode between said isolating structures, and an interconnect layer connected to said heavily-doped region over said isolating structure by using said sidewall spacers of tungsten silicide as an etching stop;

(i) implanting impurities into said substrate to form lightly-doped source/drain regions by utilizing said interconnect layer, tungsten silicide sidewall spacers, and gate electrode as masking;

(j) forming oxide spacers on sidewalls of said gate electrode as well as interconnect layer; and (k) implanting impurities into said substrate to form heavily-doped source/drain regions by utilizing said gate electrode, interconnect layer, and oxide spacers as masking.

2. The method as claimed in claim 1, wherein said gate dielectric layer is a silicon oxide layer having a thickness of about 50–150 Å.

3. The method as claimed in claim 1, wherein said first conducting layer is a polysilicon layer having a thickness of about 400–2000 Å.

4. The method as claimed in claim 1, wherein the step of forming said tungsten silicide sidewall spacers includes the step of depositing a tungsten silicide layer having a thickness of about 500–2000 Å, and then etching back.

5. The method as claimed in claim 4, wherein the step (h) is performed by reactive ion etching using a mixture of $Cl_2$ and HBr as reactive gases.

6. The method as claimed in claim 1, wherein said second conducting layer is a polysilicon layer having a thickness of about 400–2000 Å.

7. The method as claimed in claim 1, wherein the step (g) is performed by implanting phosphorus ions at an energy of about 30–80 KeV and a dosage of about $1\times10^{15}$–$1\times10^{16}$ $cm^{-2}$.

8. The method as claimed in claim 1, wherein the step (i) is performed by implanting phosphorus ions at an energy of about 50–70 KeV and a dosage of about $1\times10^{13}$–$5\times10^{13}$ $cm^{-2}$.

9. The method as claimed in claim 1, wherein the step (k) is performed by implanting arsenic ions at an energy of about 40–100 KeV and a dosage of about $1\times10^{15}$–$1\times10^{16}$ $cm^{-2}$.

* * * * *